US012781340B2

(12) United States Patent
Gassilloud et al.

(10) Patent No.: US 12,781,340 B2
(45) Date of Patent: Nov. 3, 2026

(54) CHEMICAL VACUUM DEPOSITION OF A THIN TUNGSTEN AND/OR MOLYBDENUM SULFIDE FILM METHOD

(71) Applicant: Commissariat à l'Energie Atomique et aux Energies Alternatives, Paris (FR)

(72) Inventors: Rémy Gassilloud, Grenoble Cedex (FR); Stéphane Cadot, Grenoble Cedex (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 411 days.

(21) Appl. No.: 18/066,106

(22) Filed: Dec. 14, 2022

(65) Prior Publication Data

US 2023/0183857 A1 Jun. 15, 2023

(30) Foreign Application Priority Data

Dec. 15, 2021 (FR) ....................................... 2113565

(51) Int. Cl.
*C23C 16/30* (2006.01)
*C01G 41/00* (2006.01)
*C23C 16/34* (2006.01)
*C23C 16/50* (2006.01)
*C23C 16/56* (2006.01)

(52) U.S. Cl.
CPC .......... *C23C 16/305* (2013.01); *C01G 41/006* (2013.01); *C23C 16/34* (2013.01); *C23C 16/50* (2013.01); *C23C 16/56* (2013.01)

(58) Field of Classification Search
CPC .......... C23C 16/0272; C23C 16/45523; C23C 16/45534; C23C 16/45553
See application file for complete search history.

(56) References Cited

U.S. PATENT DOCUMENTS

2004/0007179 A1* 1/2004 Lee .................. C23C 16/45544 118/715
2008/0099147 A1* 5/2008 Myo ................ C23C 16/45565 118/715
2014/0235014 A1* 8/2014 Robin ................ H10D 30/6755 438/104
2016/0168694 A1 6/2016 Min

FOREIGN PATENT DOCUMENTS

CN 107740069 A * 2/2018 .......... C23C 16/305
FR 3016889 A1 7/2015
FR 3098526 A1 1/2021

OTHER PUBLICATIONS

CN-107740069-A English translation. (Year: 2018).*
Joo et al. Atomic layer deposited Mo2N thin films using Mo(CO)6 and NH3 plasma as a Cu diffusion barrier (Year: 2021).*
CN-107740069-A English translation. (Year: 2017).*

(Continued)

*Primary Examiner* — Hai Y Zhang
(74) *Attorney, Agent, or Firm* — Merchant & Gould P.C.

(57) ABSTRACT

A method is for depositing a thin tungsten and/or molybdenum sulfide film on a substrate chemically, under vacuum.

20 Claims, 4 Drawing Sheets

(56) References Cited

OTHER PUBLICATIONS

Figure 1:
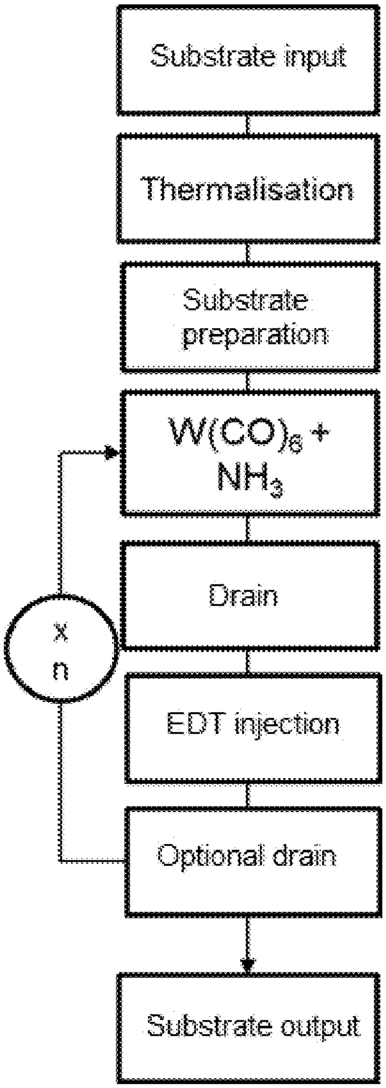

Ohuchi, F. S., Fabrication of AlN Thin Film Substrates by van der Waals Lift-off Technique, University of Washington, Apr. 29, 1998, 51 pgs.
Yang, Junjie et al., "Ultrathin molybdenum disulfide (MoS2) film obtained in atomic layer deposition: A mini-review", Science China Technological Sciences, Science China Press, Heidelberg, vol. 64, No. 11, Jul. 21, 2021 (Jul. 21, 2021), pp. 2347-2359, XP037606539, ISSN: 1674-7321, DOI: 10.1007/S11431-020-1833-4, 13 pgs.
French Office Action received for FR Serial No. FR2113565 on Aug. 22, 2022, 8 pgs.

* cited by examiner

CHEMICAL VACUUM DEPOSITION OF A THIN TUNGSTEN AND/OR MOLYBDENUM SULFIDE FILM METHOD

The present invention relates to a method for depositing a thin tungsten and/or molybdenum sulfide film on a substrate chemically, under vacuum.

Transition metal dichalcogenides constitute a class of materials with unique properties based on the high degree of anisotropy associated with their crystalline structures. These materials crystalize in a layer structure wherein the atoms forming each layer are bonded covalently while the adjacent layers are weakly held by van der Waals forces. For this reason, these materials are often called "van der Waals materials".

Among them, tungsten disulfide ($WS_2$) has particular electrical properties linked to its particularly anisotropic sheet structure. It is a single-sheet direct gap, and multi-sheet indirect gap semi-conductor, which has a satisfactory electronic mobility in the plane compared with silicon. It also intrinsically has flexibility features. Thus, tungsten disulfide can be used as a channel layer to produce flexible thin layer transistors, flexible screens and others. The out-of-plane conductivity is also specific, thus the $WS_2$ is also very studied as an alternative to resistive memories with final dimensional scales, or dimension and electrical consumption must be optimized. In this case, it is integrated in the form of a so-called MIM (metal-insulator-metal)-sulfide vertical structure between two electrode metals. It is also used as a substrate for manufacturing thin aluminum nitride (AlN) films which could be easily detached from this substrate and thus transferred (Ohuchi, F. S., *Fabrication of AlN Thin Film Substrates by van der Waals Lift-off Technique*, University of Washington, Apr. 29, 1998). There are different solutions to synthesize the $WS_2$, of which in particular its synthesis in the form of an on-silicon thin film chemically under vacuum.

Thus, the synthesis of tungsten disulfide chemically under vacuum (CVD) is known from the prior art. It generally calls upon a tungsten hexacarbonyl mixture ($W(CO)_6$)+dihydrogen sulfide ($H_2S$). However, hydrogen sulfide is an extremely toxic gas, the presence of which, in particular in a microelectronic clean room, is generally not desired. Furthermore, the control in thickness of the 2D layer by 2D layer growth is difficult, and the films obtained are generally thick (typically 60 sheets or more), due to a growth speed which is too high. Finally, the growth is of the 2D/3D type with the presence in the films obtained of perpendicular grains on the surface. Thus, it is difficult in these CVD methods to adjust the thickness of tungsten disulfide to a nanometric level, and it is difficult to make tungsten disulfide having a two-dimensional nanostructure grow evenly over a large surface. Yet, these features are highly desired for their advantageous electrical and optical properties.

It must be noted that a drop in temperature general used for ALD (atomic layer deposition), for example to a temperature less than that of the decomposition of carbonyl (in particular, less than 200° C.), does not make it possible to obtain non-rough thin layers on an $SiO_2$/Si substrate. Indeed, homogeneous nucleation is difficult to obtain, as first there is not temperature window making it possible to achieve an ALD-type growth regime for tungsten hexacarbonyl, which tends to instantaneously and fully lose all its carbonyl groups at a temperature close to its decomposition temperature. Moreover, the metal core W thus released tends to react rapidly with surface hydroxyl groups, naturally present on an oxidized surface, and thus blocks the diffusivity of the metal element on the surface, which leads to a 2D/3D growth.

Temperatures greater than those typically used in CVD have also been studied. But, these methods call upon temperatures greater than or equal to 550° C., which is not advantageous from an economic and environmental standpoint, and dihydrogen sulfide, discussed above, or very long reaction times, once again disadvantageous from an economic and environmental standpoint.

An aim of the invention is thus to provide a method for preparing a thin, uniform, conform and non-rough film, in particular having a roughness Ra less than 0.6 or 0.6 nm, of a tungsten and/or molybdenum sulfide, even disulfide.

Another aim of the invention is to provide a preparation method making it possible to obtain such thin films, conform and non-rough, in particular having a roughness Ra less than 0.6 or 0.5 nm, on large substrate surfaces, for example on surfaces of 200 to 300 nm in diameter. Another aim of the invention is to provide a method for preparing tungsten and/or molybdenum sulfide, even disulfide films making it possible to carry other conform material layers, for example aluminum nitride, by giving them the desired texture, in particular, non-rough.

Absolutely surprisingly, the method of the invention makes it possible to obtain a 2D growth of the tungsten and/or molybdenum sulfide, even disulfide films, in a plane parallel to the substrate, contrary to methods of the prior art, wherein the 2D/3D-type growth with grains perpendicular to the surface.

Also, another aim of the invention is to provide a method for preparing tungsten and/or molybdenum sulfide, even disulfide films which is simple to implement, in particular which can avoid, if desired, the use of very toxic chemical compounds, for example dihydrogen sulfide ($H_2S$), as mentioned above, an extremely toxic gas. Indeed, the inhalation of hydrogen sulfide can cause the degeneration of the olfactory nerve (making the detection of the gas impossible) and rapidly cause a loss of knowledge then death.

Also, another aim of the invention is to provide a method for preparing tungsten and/or molybdenum sulfide, even disulfide films which is possible to implement temperatures less than 500° C., even less than or equal to 410° C. This makes it possible to not expose substrates to high temperatures, in particular 500° C. or more, thus making it possible to treat sensitive, even unstable substrates at these high temperatures. Furthermore, these high temperatures are disadvantageous from an economic and environmental standpoint.

OBJECT OF THE INVENTION

Thus, according to a first aspect, the invention relates to a method for forming, on a surface of a substrate, chemically under vacuum, of a thin film constituted of or comprising a compound of formula $WS_x$, $MoS_x$ or $Mo_{1-y}W_yS_x$, with y being between 0 and 1, and x being between 1.5 to 2, comprising the following steps:

a) A step of introducing the substrate in a reactional chamber under vacuum, at a substrate temperature of between 200 and 500° C.;

b) A step of preparing the substrate comprising the injection of a dihydrogen-, helium-, argon-, dinitrogen- or $NH_3$-based gas, taken individually or in a mixture;

c) A step of injecting, in the reactional chamber, of a gaseous mixture constituted of or comprising a tungsten hexacarbonyl and/or an Mo hexacarbonyl, and at least one nitrogen element and optionally at least one hydrogen element, or of simultaneous tungsten hexacarbonyl and/or Mo hexacarbonyl injection, and of at least one nitrogen element and optionally of at least one hydrogen element, d) A step of draining said gaseous mixture;

e) A step of contacting the treated substrate such as obtained from step c) with a sulphurous gas comprising at least one free thiol group or forming a reactional intermediary comprising at least one free thiol group, to form on the substrate, a layer comprising the compound of formula $WS_x$, $MoS_x$ or $Mo_y$ $W_{1-y}S_x$.

According to an embodiment, step c) is a step of injecting, into the reactional chamber, a gaseous mixture constituted of or comprising a tungsten hexacarbonyl and/or an Mo hexacarbonyl, and at least one nitrogen element, or simultaneously injecting tungsten hexacarbonyl and/or Mo hexacarbonyl, and at least one nitrogen element.

According to another embodiment, step c) is a step of injecting, into the reactional chamber, of a gaseous mixture constituted of or comprising a tungsten hexacarbonyl and/or an Mo hexacarbonyl, and at least one nitrogen element and at least one hydrogen element, or simultaneously injecting tungsten hexacarbonyl and/or Mo hexacarbonyl, and at least one nitrogen element and at least one hydrogen element.

According to an embodiment, step c) leads to the formation on the substrate of tungsten and/or molybdenum nitride.

According to an embodiment, step e) is carried out under sulphurous gas saturation to totally or substantially convert tungsten and/or molybdenum nitride formed from step c) into compound of formula $WS_x$, $MoS_x$ or $Mo_y$ $W_{1-y}S_x$ such as defined above.

According to an embodiment, x is greater than or equal to 1.7.

According to an embodiment, the substrate is chosen from among silicon, silica, silicon nitride, metal oxides, and metal nitrides.

According to an embodiment, the substrate is made of silicon or silica, in particular silicon.

According to an embodiment, the substrate is chosen from among silicon nitride SiN and metal nitrides, in particular nitrides of element(s) III, IV, V or VI, in particular, AlN, TiN, ZrN, HfN, VN, WN, NbN, and TaN, the substrates being more specifically SiN, TiN, WN or AlN.

According to an embodiment, the substrate is chosen from among metal oxides, in particular oxides of element(s) III, IV, V or VI, in particular $Al_2O_3$, $HfO_2$, $TiO_2$, and semi-noble metal oxides, in particular CoO, NiO, $Cu_2O$, CuO, and ZnO.

According to an embodiment, at least one of the steps of all of the steps is/are carried out at a temperature of between 360 and 450° C., in particular at about 410° C.

According to an embodiment, the gas of step b) is dihydrogen, argon, a dihydrogen-argon mixture, dinitrogen, ammoniac, a dinitrogen-dihydrogen mixture, a dinitrogen-ammoniac mixture, a dihydrogen-ammoniac mixture, helium, a dihydrogen-helium mixture, or an argon-helium mixture.

According to an embodiment, step b) is carried out under plasma enhancement, in particular in situ or remote.

According to an embodiment, step b) is carried out for a duration of 2 to 900 seconds.

According to an embodiment, the substrate is a silicon nitride or a metal nitride, and step b) is optionally carried out under plasma enhancement, in particular without plasma enhancement, the gas of step b) being in particular, dihydrogen, a dihydrogen-argon mixture, ammoniac, a dinitrogen-dihydrogen mixture, a dinitrogen-ammoniac mixture, a dihydrogen-ammoniac mixture, helium, a dihydrogen-helium mixture, or an argon-helium mixture.

According to an embodiment, the substrate is made of silicon or a metal oxide, and step b) is carried out under plasma enhancement, in particular in situ or remote, in particular with a gas chosen from among dihydrogen, argon, helium, and their mixtures; or from among dinitrogen, ammoniac and their mixtures, optionally in the presence of dihydrogen, argon and/or helium.

According to an embodiment, the vacuum is a primary or secondary vacuum, in particular primary.

According to an embodiment, step c) is carried out by injecting a gaseous mixture comprising a tungsten hexacarbonyl and/or an Mo hexacarbonyl, and $NH_3$, or simultaneously injecting tungsten hexacarbonyl and/or an Mo hexacarbonyl, and $NH_3$.

According to an embodiment, step c) is carried out by injecting a gaseous mixture comprising a tungsten hexacarbonyl and/or an Mo hexacarbonyl, and at least one nitrogen element and at least one hydrogen element, or simultaneously injecting tungsten hexacarbonyl and/or an Mo hexacarbonyl, and at least one nitrogen element and at least one hydrogen element.

According to an embodiment, step c) is carried out for a duration of 2 to 20 seconds, in particular of about 10 seconds.

According to an embodiment, draining step d) is carried out by passage of an inert gas, in particular argon and/or helium and/or dinitrogen.

According to an embodiment, draining step d) is carried out for a duration less than or equal to 2 seconds.

According to an embodiment, the sulphurous gas is chosen from among ethane-1,2-dithiol (EDT), $H_2S$, dimethyl disulfide (DMDS), diethyl disulfide (DEDS), dipropyl disulfide (DPDS), dibenzyl disulfide (DBDS), di-tert-butyl disulfide (DTBDS), tert-butylthiol (t-BuSH), thiophenol and their mixtures.

According to an embodiment, step e) is carried out in the presence of dihydrogen, and/or an inert carrier gas, in particular argon and/or helium.

According to an embodiment, step e) is carried out under plasma activation.

According to a particular embodiment, step e) is carried out in the presence of dihydrogen and/or an inert carrier gas, in particular argon and/or helium and/or dinitrogen, without plasma activation.

According to a particular embodiment, step e) is carried out in the presence of dihydrogen, and/or an inert carrier gas, preferably argon and/or helium, under plasma activation.

According to an embodiment, step e) is carried out for a duration of 1 to 20 seconds, in particular of about 10 seconds.

According to an embodiment, step e) is followed by a step f) of draining said sulphurous gas.

According to a particular embodiment, draining step f) is carried out by passage of an inert gas, in particular argon and/or helium and/or dinitrogen.

According to another particular embodiment, draining step f) is carried out for a duration less than or equal to 2 seconds.

According to an embodiment, the method according to the invention comprises the following steps:

a) A step of introducing the substrate into a primary reactional chamber under vacuum, at a substrate temperature of between 200 and 500° C., in particular at a temperature of between 360 and 450° C., in particular at about 410° C.;

b) A step of preparing the substrate comprising the injection of a dihydrogen-, helium-, argon-, dinitrogen- or $NH_3$-based gas, taken individually or in a mixture, for a duration of 2 to 900 seconds;

c) A step of injecting, into the reactional chamber, a gaseous mixture comprising a tungsten hexacarbonyl and/or an Mo hexacarbonyl, and $NH_3$, or simultaneously injecting tungsten hexacarbonyl and/or an Mo hexacarbonyl, and $NH_3$, for a duration of 2 to 20 seconds, in particular of about 10 seconds;

d) A step of draining said gaseous mixture by passage of an inert gas, in particular argon and/or helium, for a duration less than or equal to 2 seconds;

e) A step of contacting, the treated substrate such as obtained from step c) with a sulphurous gas comprising at least one free thiol group or forming a reactional intermediary comprising at least one free thiol group, in particular chosen from among ethane-1,2-dithiol (EDT), $H_2S$, dimethyl disulfide (DMDS), diethyl disulfide (DEDS), dipropyl disulfide (DPDS), dibenzyl disulfide (DBDS), di-tert-butyl disulfide (DTBDS), tert-butylthiol (t-BuSH), thiophenol and their mixtures to form on the substrate, a layer comprising the compound of formula $WS_x$, $MoS_x$ or $Mo_y$ $W_{1-y}S_x$, in particular in the presence of dihydrogen, and/or an inert carrier gas, in particular argon and/or helium, and/or under plasma activation, for a duration of 1 to 20 seconds, in particular of about 10 seconds:

Optionally, a step of draining said sulphurous gas by passage of an inert gas, in particular argon and/or helium and/or dinitrogen, for a duration less than or equal to 2 seconds.

According to an embodiment, the residual nitrogen rate of the layer obtained from step e) is less than 5 atomic %.

According to an embodiment, the thickness of the layer obtained from step e) being about 0.7 Å per cycle of steps b) to e).

According to an embodiment, steps b) to e) or optionally f) are renewed, until obtaining the number of sheets desired, in particular 1 to 20 sheets, in particular 1 to 6, for example 3 sheets.

According to an embodiment, step e), or, when it exists, step f), is followed by an annealing step, in particular at a temperature of 700° C. or more.

According to another aspect, the invention also relates to a method for preparing a stack of layers, comprising steps a) to e) even f) such as defined above, step e), or, when it exists, step f), being followed by an annealing step, in particular at a temperature of 700° C. or more, then a step of depositing a layer of a nitride of element(s) III or of a compound III-V.

DETAILED DESCRIPTION OF THE INVENTION

Definitions

Such as is understood in this case, the value ranges in the form of "x-y" or "from x to y" or "between x and y" include the limits x and y, as well as integers between these limits, and actual positive numbers between these limits and/or integers. As an example, "1-5", or "from 1 to 5" or "between 1 and 5" mean integers 1, 2, 3, 4 and 5. Preferred embodiments include each integer taken individually in the value range, as well as any sub combination of these integers. As an example, the preferred values for "1-5" can comprise the integers 1, 2, 3, 4, 5, 1-2, 1-3, 1-4, 1-5, 2-3, 2-4, 2-5, etc.

By "thin film", this means, in particular a layer constituted of or comprising a compound of formula $WS_x$, $MoS_x$ or $Mo_y$ $W_{1-y}S_x$, with y being between 0 and 1, and x being from 1.5 to 2, in particular greater than or equal to 1.7. It is in the form of this layer that said compound can be formed by chemical vacuum deposition.

By "chemical vacuum deposition", this means, in particular, a Chemical Vapour Deposition (or CVD).

By "reactional chamber under vacuum", this means, in particular, a chemical vacuum deposition chamber, or CVD chamber.

By "roughness Ra", this means, in particular, the average distance between the average line and the peaks and the cavities of a given surface. This is therefore, in particular, for a given surface, the average difference, or arithmetic average, of the distances between successive peaks and cavities.

"Ra" thus corresponds in particular to the difference between this average distance and the "central line".

The roughness Ra can, in particular, be evaluated by atom force microscope (AFM) or by X reflectivity.

This roughness is, for example, measured by AFM, on a characteristic scan of 1*1 μm and an extraction by arithmetic average or moment of order 2.

The Growth Method According to the Invention

According to the present chemical vacuum method, a thin film is formed and grows on a substrate placed in a reaction chamber at high temperatures. The general chemical vacuum principles are well-known to a person skilled in the art.

When used in step c), a gaseous mixture comprising a tungsten hexacarbonyl and $NH_3$ (or a gaseous mixture such as defined below), is formed on the substrate, from step e), a layer comprising the compound of formula $WS_x$ such as defined above.

When used in step c), a gaseous mixture comprising a molybdenum hexacarbonyl and $NH_3$ (or a gaseous mixture such as defined below), is formed on the substrate, from step e), a layer comprising the compound of formula $MoS_x$ such as defined above.

When used in step c), a gaseous mixture comprising a tungsten hexacarbonyl, a molybdenum hexacarbonyl and $NH_3$ (or a gaseous mixture such as defined below), is formed on the substrate, from step e), a layer comprising the compound of formula $Mo_y$ $W_{1-y}S_x$ such as defined above.

Without wishing to be limited to any theory, the gaseous mixture of step c) leads to the formation on the substrate of tungsten and/or molybdenum nitride, which is totally or substantially converted from step e) into compound of formula $WS_x$, $MoS_x$ or $Mo_y$ $W_{1-y}S_x$ such as defined above.

The value x can, for example, and if necessary, be modified by modifying the temperature at which the substrate is carried, which is defined below. For example, a temperature of 360° C., 410° C. and 450° C. can make it possible to obtain a value x of about 2, about 1.7 and 1.6, respectively.

Introduction of the Substrate into the Chamber

As defined above, the substrate is placed in a reaction chamber under vacuum, such that it is under vacuum, at a temperature of between 200 and 500° C., for the following steps.

This substrate temperature can be constant or substantially constant during the steps. This substrate temperature can also be different for at least one of these steps, while also being between 200 and 500° C.

Step of Preparing the Substrate

By "nitride of element(s) III, IV, V or VI", this means, in particular, a nitride of at least one element of the column III B (boron, gallium, aluminum, indium, etc.) of Mendeleev's periodic table, in particular AlN, a nitride of at least one element of the column IV A (titanium, zirconium, hafnium, etc.) of Mendeleev's periodic table, in particular TiN, HfN and ZrN, a nitride of at least one element of the column V A (vanadium, niobium, tantalum, etc.) of Mendeleev's periodic table, in particular VN, NbN and TaN, and a nitride of at least one element of the column VI A (chromium, molybdenum, tungsten, etc.) of Mendeleev's periodic table, in particular WN, respectively.

By "oxide of element(s) III, IV, V or VI", this means, in particular, a nitride of at least one element of the column III B (boron, gallium, aluminum, indium, etc.) of Mendeleev's periodic table, in particular $Al_2O_3$, a nitride of at least one element of the column IV A (titanium, zirconium, hafnium, etc.) of Mendeleev's periodic table, in particular $TiO_2$ and $HfO_2$, a nitride of at least one element of the column V A (vanadium, niobium, tantalum, etc.) of Mendeleev's periodic table, and a nitride of at least one element of the column VI A (chromium, molybdenum, tungsten, etc.) of Mendeleev's periodic table, respectively.

By "semi-noble metal oxide", this means, for example, CoO, NiO, $Cu_2O$, CuO, or ZnO.

The substrate is prepared in step b) whatever its nature.

The use or not of a plasma enhancement can in particular depend on the nature of this substrate.

In particular, when the substrate is a silicon nitride or a metal nitride, the latter is prepared by using, as gas, dihydrogen, a dihydrogen-argon mixture, ammoniac, a dinitrogen-dihydrogen mixture, a dinitrogen-ammoniac mixture, or a dihydrogen-ammoniac mixture, with or not plasma enhancement, in particular without plasma enhancement.

When the substrate is made of silicon or a metal oxide, its preparation is done generally under plasma enhancement, in particular in situ or remote, in particular with a gas chosen from among dihydrogen, argon, and their mixtures; or from among dinitrogen, ammoniac and their mixtures, optionally in the presence of dihydrogen, argon and/or helium.

This plasma enhancement, in particular in situ or remote, is well-known to a person skilled in the art. It can, for example, appear in the form of an option to select in CVD deposition devices conventionally used.

By "in situ plasma enhancement", this means in particular, capacitively coupled plasma enhancement (CCP), i.e. under capacitive plasma discharge. Generally, an alternating or radiofrequency current is applied between an electrode and the conductive walls of the reactional chamber (or between two cylindrical electrodes facing one another). The latter configuration is known in the form of a parallel plate reactor.

By "remote plasma enhancement", this means, in particular, an inductively coupled plasma (ICP) enhancement. Generally, the inductive plasma is obtained and maintained by a torch which consists of three concentric tubes, generally made of quartz. The end of this torch is located inside an induction coil powered by a high-frequency current. A gas flow is introduced between the two outer tubes of the torch and a spark generates the first free electrons in the gas flow.

By "primary vacuum", this means, in particular, a pressure of between 760 T and 0.001 T (Torr).

By "secondary vacuum", this means, in particular, a pressure less than 0.001 mT.

Step of Injecting a Gaseous Mixture comprising a Hexacarbonyl and at Least one Nitrogen Element By "at least one nitrogen element", this means, in particular, any gas comprising at least one nitrogen and which can form tungsten and/or molybdenum nitride in reaction with a tungsten hexacarbonyl and/or an Mo hexacarbonyl. This is, in particular, any nitrogenous compound or mixture comprising a nitrogenous compound which can form $NH_3$ under temperature and pressure conditions of the reactional chamber. It can, for example, be ammoniac or a $N_2H_4/H_2$ mixture. It can also, for example, be ammoniac, with or without Ar, or an ammoniac/$N_2$ mixture, with or without Ar.

By "at least one nitrogen element and at least one hydrogen element", this means, in particular, any gas or gas mixture comprising at least one nitrogen and at least one hydrogen mixed together and which can form tungsten and/or molybdenum nitride in reaction with a tungsten hexacarbonyl and/or an Mo hexacarbonyl. This is, in particular, any nitrogenous compound in a mixture in a reducing gas such as dihydrogen which can form $NH_3$, and $NH_2$ and NH radical compounds under plasma activation, under the temperature and pressure conditions of the reactional chamber.

It can, for example, be an ammoniac/$H_2$ mixture or an $N_2H_4/H_2$ mixture, or an $N_2$ and $H_2$ mixture. By "gaseous mixture comprising ( . . . ) at least one nitrogen element", this can also mean an $N_2/H_2$ plasma with or without Ar, or an $NH_3$ plasma with or without Ar, or $NH_3/N_2$ with or without Ar, or $NH_3/H_2$ with or without Ar, leading to the formation of $NH_3$, $NH_2$, NH radicals.

Thus, according to a particular embodiment, the gaseous mixture comprising a tungsten hexacarbonyl and/or an Mo hexacarbonyl comprises in addition to a gas, a gaseous mixture chosen from among ammoniac ($NH_3$), with or without Ar, an ammoniac/$N_2$ mixture, with or without Ar, an ammonaic/$H_2$ mixture, an $N_2H_4/H_2$ mixture, an $N_2$ and $H_2$ mixture, an $N_2/H_2$ plasma with or without Ar, an $NH_3$ plasma with or without Ar, an $NH_3/N_2$ plasma with or without Ar, an $NH_3/H_2$ plasma with or without Ar.

The injection of the gaseous mixture during step c) is done according to one of the techniques well-known to a person skilled in the art.

It can be the injection of the preformed gaseous mixture itself.

It can also be a simultaneous injection of hexacarbonyl and gas or gaseous mixture such as described above, in particular $NH_3$. This co-injection is thus performed such that the two gases or gaseous mixtures are mixed before contact or upon contact with the substrate. This co-injection can be performed by one of the techniques well-known to a person skilled in the art.

By $NH_3$, this means, in particular, ammoniac, in the form of gas in the scope of the present invention.

Without wishing to be limited to any theory, and as indicated above, the gaseous mixture of step c) leads to the formation on the tungsten and/or molybdenum nitride substrate.

Step of Draining the Gaseous Mixture

This step is carried out such that the injected sulphurous gas as described below is not substantially mixed with the gases or gaseous mixtures such as described above, in particular ammoniac $NH_3$ and tungsten and/or molybdenum hexacarbonyl.

The duration of this draining step d) can easily be determined by a person skilled in the art to achieve this aim. This duration depends, in particular, on the volume of the reactor, as well as primary or secondary pumping means. It is typically less than or equal to 2 seconds.

Step of Contacting with a Sulphurous Gas

By "free thiol group", this means, in particular, a —SH group.

By "forming a reactional intermediary comprising at least one free thiol group", this means, in particular, a gas which can form, in situ, a sulphurous gas comprising at least one free thiol group. It can, for example, be a compound comprising a —S—S— bond, in the presence of dihydrogen.

Thus, the sulphurous gas is, in particular, a gaseous compound comprising a —SH group, or a —S—S— bond which can form the two —SH groups in reaction with dihydrogen under temperature and pressure conditions of the reactional chamber.

This compound can be hydrogen disulfide or a gaseous organic compound comprising a —SH group or a —S—S— bond which can form the two —SH groups under temperature and pressure conditions of the reactional chamber.

This organic compound is in gas form under temperature and pressure conditions of the reactional chamber, even also in gas form prior to injection into the reactional chamber.

The sulphurous gas can be chosen from among 1,2-ethane di-thiol, ethane thiol, t-BuSH, thiophenol and their mixtures, in particular in the absence of $H_2$, optionally with a reducing plasma activation.

The sulphurous gas can also be chosen from among DMDS, DEDS, DPDS, DBDS, DTBDS, di-tertbuthyl disulfide, and their mixtures, in mixture with $H_2$, and optionally with a reducing plasma activation.

Without wishing to be limited to any theory, and as mentioned above, the tungsten and/or molybdenum nitride formed in step c) is totally or substantially converted from step e) into compound of formula $WS_x$, $MoS_x$ or $Mo_y$ $W_{1-y}S_x$ such as defined above.

By "substantially", this means, in particular, a conversion such that the residual nitrogen rate of the layer obtained from step e) is less than 5 atomic %.

This step is, in particular, carried out in the presence of dihydrogen, and/or an inert carrier gas, in particular argon and/or helium, and/or under plasma activation.

By "inert carrier gas", this means, in particular, argon and/or helium and/or dinitrogen.

Step of Draining a Sulphurous Gas

This optional step is carried out for a duration which is easily determinable by a person skilled in the art to achieve this aim. It is typically less than or equal to 2 seconds.

It can be omitted, in particular to enable a shorter method.

It can also be carried out one single time, from the desired number of cycles of steps b) to e).

Optional Subsequent Steps

An annealing step can be carried out from the steps described above. This annealing step makes it possible, in particular, to crystallize the layer obtained from step e) to obtain a thin crystallized $WS_x$, $MoS_x$ or $Mo_y$ $W_{1-y}S_x$ film.

This annealing step can be followed by a step of depositing a layer of a nitride of element(s) III or of a compound III-V, for example aluminum nitride, to obtain the corresponding stack of layers.

By "nitride of element(s) III", this means, in particular, a nitride of at least one element of the column III B (boron, gallium, aluminum, indium, etc.) of Mendeleev's periodic table, in particular AN.

By "compound III-V", this means, in particular, a material composed of one or more elements of column III B (boron, gallium, aluminum, indium, etc.) and of column V B (arsenic, antimony, phosphorous, etc.) of Mendeleev's periodic table, such as gallium arsenide, indium arsenide, gallium nitride, gallium antimony, boron phosphorus or ternary alloys such as $In_aGa_{1-a}As$.

It must be noted that the thin film obtained from the method can be used in the raw state with or without annealing, in particular for producing an active layer of a memory in Metal/Insulator/Metal (MIM) integration.

FIGURES

FIG. 1 illustrates the steps of an example of a method for forming a $WS_x$, $MoS_x$ or $Mo_y$ $W_{1-y}S_x$ layer, with y being between 0 and 1, and x being from 1.5 to 2 by CVD, according to the invention.

Figure 2:
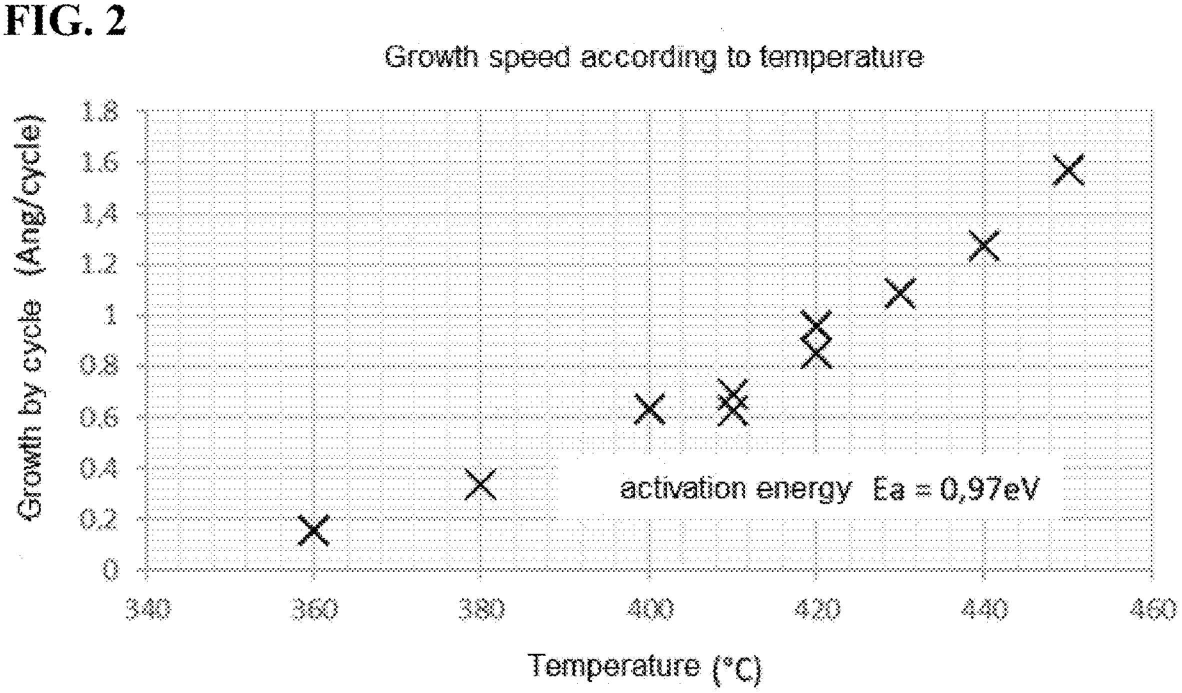

FIG. 2 presents the growth speed of the thin film according to example 1, according to the temperature of the substrate.

Figure 3:
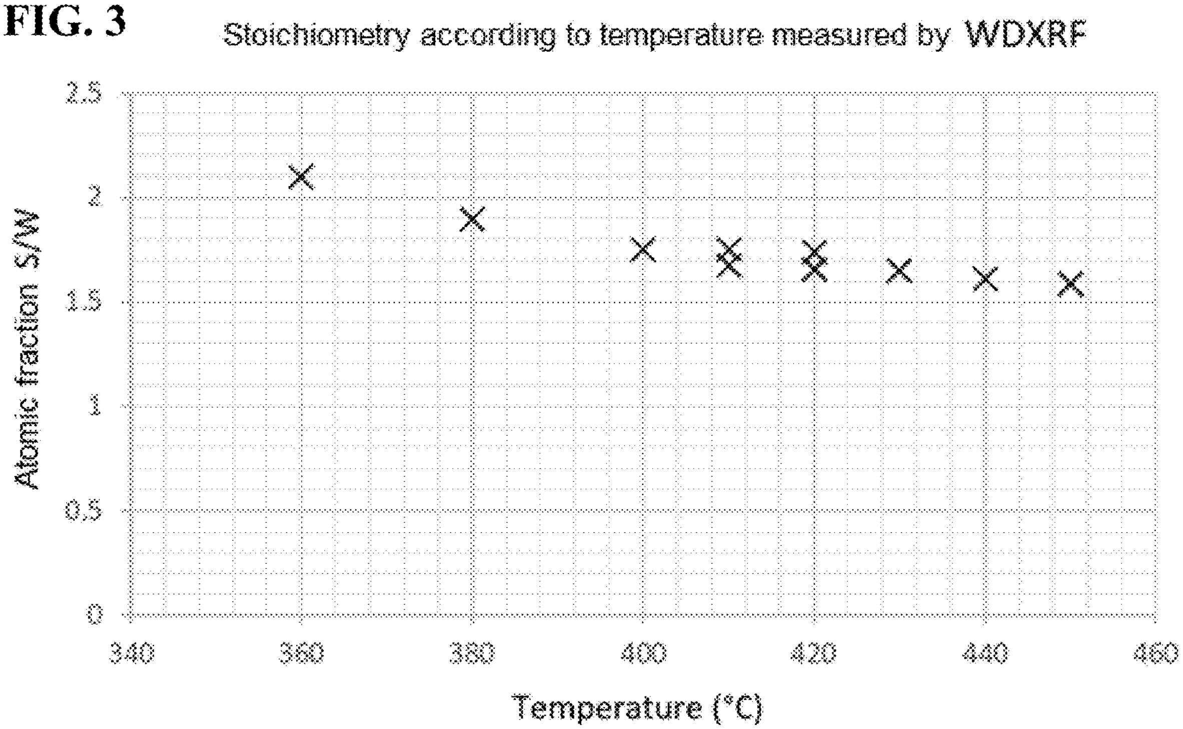

FIG. 3 shows the study of the stoichiometry of the $WS_x$ tungsten sulfide obtained according to example 1 according to the temperature by wavelength dispersive X-ray fluorescence spectroscopy (WDXRF).

Figure 4:
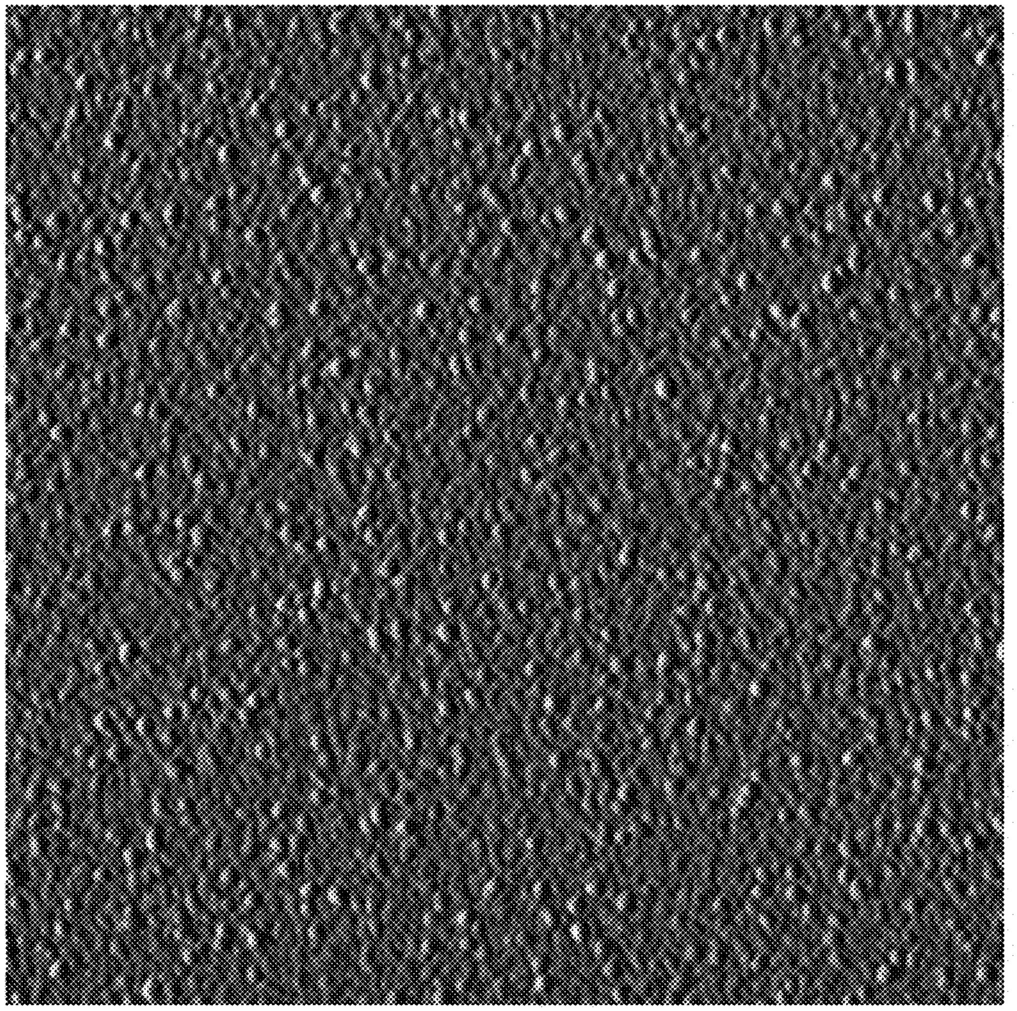

FIG. 4 relates to the topology of a square of 1×1 μm of the surface of a thin film after deposition according to example 1. Roughness RMS=0.4 nm.

Figure 5A:
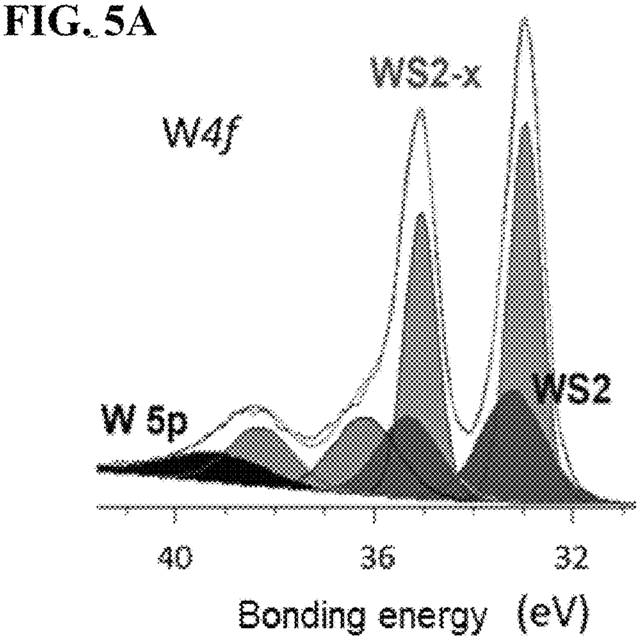
Figure 5B:
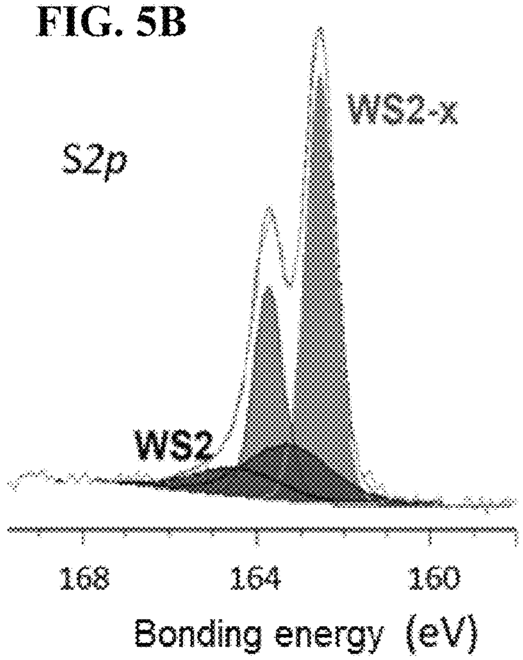
Figure 5C:
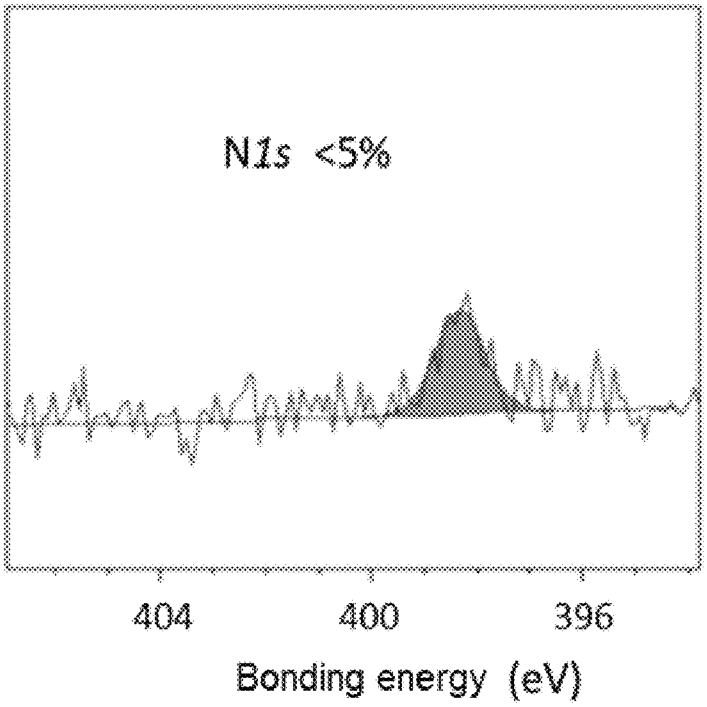

FIGS. 5A, 5B, and 5C correspond to an analysis of the surface of a thin film after deposition according to example 1 by X photoelectronic spectrometry (XPS) relative to W4f (A), S2p (B), N1s (C).

EXAMPLES

Example 1: Obtaining of a Tungsten Sulfide

In a standard CVD deposition reactor, under primary vacuum (2 Torr), wherein a silicon trench-type substrate (bulk or SOI (silicon on insulator)) has been placed beforehand, at 410° C., said substrate has been prepared by injection of a dihydrogen-, helium-, argon-, dinitrogen- or $NH_3$ (ammoniac)-based gas, taken individually or in a mixture, with or without plasma enhancement, generally in situ or remote, in particular in order to reduce, if necessary, the duration of this step and therefore of the method. This preparation makes it possible to remove the residual oxygen in the reactor, as well as the wet condensates on the surface. If necessary, it also has the role of reducing the number of hydroxyl bonds on the oxidized surfaces.

The duration of this step is typically in the range 2-900 s, depending on the presence or not of plasma enhancement, and if so, of the plasma enhancement chosen.

Then, at the same time, ammoniac $NH_3$ and $W(CO)_6$ tungsten hexacarbonyl (commercially available) have been injected.

The duration of this step must not exceed a value which would not enable sulfidation at the core of the $W_zN_{z'}$ phase at the time of exposure of the sulphurous gas such as described below. The duration of this step is generally in the range 2-20 s, preferably 10 s.

From this step, an extremely thin tungsten nitride film (of $W_zN_{z'}$-type) is formed.

A draining step, carried out by flow rate of a neutral gas, has then been carried out, such that the injected sulphurous gas as described below is not mixed with ammoniac $NH_3$ and with $W(CO)_6$ tungsten hexacarbonyl (which would lead to a $W_zN_{z'}S_{z''}$ mixture that is not sought to achieve, as well as the uncontrolled formation of powders).

The draining time, and in particular the maximum draining time, depends in particular on the geometry of the reactor, and is typically less than 2 seconds. This draining time is suitable for the device used to achieve the aim described above.

A sulphurous gas of the 1,2 ethane di-thiol (EDT) type is then injected. The latter can be used pure or in a mixture with a neutral carrier gas. Other molecules of the same family can be successfully used (pure or in a mixture), in particular, ethane thiol, DMDS, DEDS, DPDS, DBDS, DTBDS, t-BuSH, di-tertbuthyl disulfide, thiophenol, in a mixture or not with $H_2$, and optionally with a reducing plasma activation.

More specifically, it can be 1,2-ethane di-thiol, ethane thiol, t-BuSH or thiophenol, in particular in the absence of $H_2$, optionally with a reducing plasma activation.

It can also be DMDS, DEDS, DPDS, DBDS, DTBDS, or di-tertbuthyl disulfide, in a mixture with $H_2$, and optionally with a reducing plasma activation. This step makes it possible to convert the tungsten nitride formed beforehand into $WS_x$-type tungsten sulfide, x being from 1.5 to 2.

The duration of this step depends on the conversion time of $W_zN_{z'}$-type tungsten nitride into $WS_x$-type tungsten sulfide, and therefore on the thickness of $W_zN_{z'}$, and is generally in the range 1-20 seconds, preferably 10 seconds.

A new draining step, this time optional, can be carried out here.

A growth cycle corresponds to the sequential exposure of the substrate to the $W(CO)_6+NH_3$ mixture, then the EDT, it all separated by a draining step. The final thickness of the deposition is obtained by multiplying the cycles.

The growth speed depends on the deposition temperature, in the range 200-500° C., preferably 360-450° C., for example 410° C. This is a so-called pulsed chemical deposition regime. The term "pulsed" describes a technical solution where the substrate is sequentially exposed to gases, in order to limit the chemical interactions by direct mixture, and wherein neutral gas draining sequences are associated to guarantee the separation of the chemistries.

The deposition speed is around 0.7 Ang. per cycle. An Arrhenius-type analysis of FIG. 2 makes it possible to extract an activation energy of around 1 eV.

The film obtained is closed, uniform, slightly rough, in particular having a roughness Ra less than 0.6 or 0.5 nm, and conform (FIG. 4).

It must be noted that a very low residual atomic percentage of N (<5%) can optionally be detected by XPS in the film after deposition (FIG. 5).

It must be noted also that the value x can, for example, and if necessary, be modified by way of the temperature at which the substrate is carried. For example, a temperature of 360° C., 410° C. and 450° C. can make it possible to obtain a value x of about 2, about 1.7 and 1.6, respectively (FIG. 3).

Example 2: Obtaining a Molybdenum Sulfide or an Mo-W Sulfide.

A compound of formula Mos such as defined above is successfully obtained according to a protocol similar to that described in example 1, by using a molybdenum hexacarbonyl instead of tungsten hexacarbonyl.

In addition, a compound of formula $Mo_y W_{1-y}S_x$ such as defined above is successfully obtained according to a protocol similar to that described in example 1, by using a tungsten hexacarbonyl/molybdenum hexacarbonyl mixture instead of tungsten hexacarbonyl.

Example 3: Implementation of a crystallization annealing

The thin film obtained from examples 1 and 2 can be used with or without annealing, in particular to produce an active layer of a memory in Metal/Insulator/Metal (MIM) integration.

This annealing can be necessary for other applications, where the presence of a thin crystallized film is desirable, even necessary.

Thus, the thin film obtained from example 1 or 2 has been annealed at a temperature of 700° C. or more, successfully, to obtain a thin, crystallized $WS_x$, $MoS_x$ or $Mo_y W_{1-y}S_x$ film.

The invention claimed is:

1. A method for forming, on a surface of a substrate, chemically under vacuum, of a thin film comprising a compound of formula $WS_x$, $MoS_x$ or $Mo_yW_{1-y}S_x$, with y being between 0 and 1, and x being from 1.5 to 2, comprising the following steps:

a) A step of introducing the substrate in a reactional chamber under vacuum, a substrate temperature being between 200 and 500° C.;

b) A step of preparing the substrate comprising the injection of a dihydrogen-, helium-, argon-, dinitrogen- or $NH_3$-based gas, taken individually or in a mixture;

c) A step of injecting, into the reactional chamber, a gaseous mixture comprising a tungsten hexacarbonyl and/or a molybdenum (Mo) hexacarbonyl, and a gas or a gas mixture comprising at least one nitrogen and at least one hydrogen element, which can form tungsten nitride and/or molybdenum nitride in reaction with a tungsten hexacarbonyl and/or a molybdenum hexacarbonyl;

d) A step of draining said gaseous mixture; and e) A step of contacting the treated substrate as obtained from step c) with a sulphurous gas comprising at least one free thiol group or forming a reactional intermediary comprising at least one free thiol group, to form on the substrate, a layer comprising the compound of formula $WS_x$, $MoS_x$ or $Mo_yW_{1-y}S_x$.

2. The method according to claim 1, wherein step c) leads to the formation on the substrate of tungsten and/or molybdenum nitride, step e) being carried out under sulphurous gas saturation to convert the tungsten and/or molybdenum nitride formed from step c) into the compound of formula $WS_x$, $MoS_x$ or $Mo_yW_{1-y}S_x$, so that a residual nitrogen rate of the layer obtained from step e) is less than 5 atomic %.

3. The method according to claim 1, wherein the substrate is chosen from among silicon, silica, silicon nitride, metal oxides, and metal nitrides, the substrate being:

silicon or silica;

chosen from among silicon nitride SiN and metal nitrides, the substrate being more specifically SiN, TIN, WN or AlN; or chosen from among metal oxides.

4. The method according to claim 1, wherein at least one of the steps or all of the steps is/are carried out at a temperature of between 360 and 450° C.

5. The method according to claim 1, wherein:

the gas of step b) is dihydrogen, argon, a dihydrogen-argon mixture, dinitrogen, ammoniac, a dinitrogen-dihydrogen mixture, a dinitrogen-ammoniac mixture, a dihydrogen-ammoniac mixture, helium, a dihydrogen-helium mixture, or an argon-helium mixture; and/or step b) is carried out under plasma enhancement; and/or step b) is carried out for a duration of 2 to 900 seconds.

6. The method according to claim 1, wherein the substrate is:

a silicon nitride or a metal nitride, and step b) is carried out without plasma enhancement, the gas of step b) being, dihydrogen, a dihydrogen-argon mixture, ammoniac, a dinitrogen-dihydrogen mixture, a dinitrogen-ammoniac mixture, a dihydrogen-ammoniac mixture, helium, a dihydrogen-helium mixture, or an argon-helium mixture; or silicon, or silica or a metal oxide, and step b) is carried out under plasma enhancement, with a gas chosen from among dihydrogen, argon, helium, and mixtures thereof, or from among dinitrogen, ammoniac and mixtures thereof.

7. The method according to claim 6, wherein step b) is carried out under plasma enhancement, in the presence of dihydrogen, argon and/or helium.

8. The method according to claim 1, wherein the vacuum is a primary or secondary vacuum.

9. The method according to claim 1, wherein step c) is carried out:

by injecting a gaseous mixture comprising a tungsten hexacarbonyl and/or a molybdenum hexacarbonyl and $NH_3$, or simultaneously injecting tungsten hexacarbonyl and/or a molybdenum hexacarbonyl, and $NH_3$; or f) by injecting a gaseous mixture comprising a tungsten hexacarbonyl and/or a molybdenum hexacarbonyl, and a gas or a gas mixture comprising at least one nitrogen and at least one hydrogen mixed together, and which can form tungsten nitride and/or molybdenum nitride in reaction with a tungsten hexacarbonyl and/or a molybdenum hexacarbonyl, or simultaneously injecting tungsten hexacarbonyl and/or a molybdenum hexacarbonyl, and a gas or a gas mixture comprising at least one nitrogen and at least one hydrogen mixed together, and which can form tungsten nitride and/or molybdenum nitride in reaction with a tungsten hexacarbonyl and/or a molybdenum hexacarbonyl; and/or for a duration of 2 to 20 seconds.

10. The method according to claim 1, wherein the draining step d) is carried out:

by passage of an inert gas; and/or for a duration less than or equal to 2 seconds.

11. The method according to claim 1, wherein the sulphurous gas is chosen from among ethane-1,2-dithiol (EDT), dimethyl disulfide (DMDS), diethyl disulfide (DEDS), dipropyl disulfide (DPDS), dibenzyl disulfide (DBDS), di-tert-butyl disulfide (DTBDS), tert-butylthiol (t-BuSH), thiophenol and mixtures thereof.

12. The method according to claim 1, wherein step e) is carried out:

in the presence of dihydrogen, and/or an inert carrier gas; and/or under plasma activation.

13. The method according to claim 1, wherein step e) is:

carried out for a duration of 1 to 20 seconds; and/or followed by a step of draining said sulphurous gas, which is carried out:

by passage of an inert gas; and/or for a duration less than or equal to 2 seconds.

14. The method according to claim 1, which comprises the following steps:

a) A step of introducing the substrate into a primary reactional chamber under vacuum, the substrate temperature being between 200 and 500° C.;

b) A step of preparing the substrate comprising the injection of a dihydrogen-, helium-, argon-, dinitrogen- or $NH_3$-based gas, taken individually or in a mixture, for a duration of 2 to 900 seconds;

c) A step of injecting, into the reactional chamber, a gaseous mixture comprising a tungsten hexacarbonyl and/or a molybdenum hexacarbonyl, and $NH_3$, or simultaneously injecting tungsten hexacarbonyl and/or a molybdenum hexacarbonyl, and $NH_3$, for a duration of 2 to 20 seconds;

d) A step of draining said gaseous mixture by passage of an inert gas, for a duration less than or equal to 2 seconds;

e) A step of contacting the treated substrate obtained from step c) with a with a sulphurous gas comprising at least one free thiol group or forming a reactional intermediary comprising at least one free thiol group, chosen from among ethane-1,2-dithiol (EDT), dimethyl disulfide (DMDS), diethyl disulfide (DEDS), dipropyl disulfide (DPDS), dibenzyl disulfide (DBDS), di-tert-butyl disulfide (DTBDS), tert-butylthiol (t-BuSH), thiophenol and mixtures thereof to form on the substrate, a layer comprising the compound of formula $WS_x$, $MoS_x$ or $Mo_yW_{1-y}S_x$, in the presence of dihydrogen, and/or an inert carrier gas, and/or under plasma activation, for a duration of 1 to 20 seconds.

15. The method according to claim 14, further comprising a step of draining said sulphurous gas by passage of an inert gas for a duration less than or equal to 2 seconds.

16. The method according to claim 14, wherein steps b) to f) are renewed, until obtaining the desired number of sheets.

17. The method according to claim 1, wherein:

a residual nitrogen rate of the layer obtained from step e) is less than 5 atomic %;

a thickness of the layer obtained from step e) is about 0.7 Å per cycle of steps b) to e);

steps b) to e) are renewed, until obtaining the desired number of sheets; and/or step e) is followed by an annealing step.

18. The method according to claim 1, wherein x is greater than or equal to 1.7.

19. The method according to claim 1, wherein the gaseous mixture comprises at least one hydrogen element, or simultaneously injecting tungsten hexacarbonyl and/or a molybdenum hexacarbonyl, and a gas or a gas mixture comprising at least one nitrogen and at least one hydrogen mixed together, and which can form tungsten nitride and/or molybdenum nitride in reaction with a tungsten hexacarbonyl and/or a molybdenum hexacarbonyl.

20. The method for preparing a stack of layers, comprising steps a) to e) even f) defined in claim 1, step e) being followed by an annealing step, then a step of depositing a layer of a nitride of element(s) III or of a compound III-V.

* * * * *